US012218111B2

(12) United States Patent
Lee

(10) Patent No.: US 12,218,111 B2
(45) Date of Patent: Feb. 4, 2025

(54) DISPLAY APPARATUS

(71) Applicant: Seoul Semiconductor Co., Ltd., Ansan-si (KR)

(72) Inventor: Chung Hoon Lee, Ansan-si (KR)

(73) Assignee: Seoul Semiconductor Co., Ltd., Ansan-si (KR)

(*) Notice: Subject to any disclaimer, the term of this patent is extended or adjusted under 35 U.S.C. 154(b) by 0 days.

(21) Appl. No.: 18/135,178

(22) Filed: Apr. 16, 2023

(65) Prior Publication Data
US 2023/0268323 A1 Aug. 24, 2023

Related U.S. Application Data

(63) Continuation of application No. 17/108,981, filed on Dec. 1, 2020, now Pat. No. 11,664,355.

(60) Provisional application No. 62/942,567, filed on Dec. 2, 2019.

(51) Int. Cl.
*H01L 25/075* (2006.01)
*H01L 25/16* (2023.01)
*H01L 33/62* (2010.01)

(52) U.S. Cl.
CPC ........ *H01L 25/0753* (2013.01); *H01L 25/167* (2013.01); *H01L 33/62* (2013.01); *H01L 2933/0066* (2013.01)

(58) Field of Classification Search
CPC ... H01L 25/0753; H01L 25/167; H01L 33/62; H01L 2933/0066; H01L 27/156; H01L 27/1218; H01L 27/124; H01L 27/1262; H01L 33/486
See application file for complete search history.

(56) References Cited

U.S. PATENT DOCUMENTS

| | | | |
|---|---|---|---|
| 9,075,206 B2 | 7/2015 | Yanagisawa | |
| 10,615,321 B2* | 4/2020 | Choi | H01L 33/56 |
| 10,937,768 B2 | 3/2021 | Takeya | |
| 11,282,820 B2* | 3/2022 | Takeya | H01L 33/00 |
| 11,462,523 B2 | 10/2022 | Kang et al. | |
| 2017/0025593 A1* | 1/2017 | Bower | H10K 59/18 |
| 2018/0031938 A1 | 2/2018 | Watanabe et al. | |

(Continued)

FOREIGN PATENT DOCUMENTS

| | | |
|---|---|---|
| CN | 202816322 U | 3/2013 |
| CN | 213519057 U | 6/2021 |

(Continued)

OTHER PUBLICATIONS

Extended European Search Report dated Nov. 9, 2023, for European Patent Application No. 20896330.6.

(Continued)

*Primary Examiner* — Victor A Mandala
(74) *Attorney, Agent, or Firm* — Oblon, McClelland, Maier & Neustadt, L.L.P.

(57) ABSTRACT

A display apparatus including a plurality of display modules each including a module substrate and a plurality of light emitting devices mounted on the module substrate, and a support substrate on which the display modules are disposed and including electrodes, in which the module substrate includes through-holes penetrating the module substrate and vias disposed in the through-holes, and the light emitting devices are electrically connected to the electrodes of the support substrate through the vias.

15 Claims, 10 Drawing Sheets

(56) References Cited

U.S. PATENT DOCUMENTS

| | | |
|---|---|---|
| 2018/0226386 A1 | 8/2018 | Cok |
| 2019/0012956 A1* | 1/2019 | Li .......................... G09G 3/32 |
| 2019/0165207 A1 | 5/2019 | Kim et al. |
| 2021/0013099 A1* | 1/2021 | Pendse ................ H01L 25/0753 |
| 2021/0082887 A1* | 3/2021 | Jang ........................ H01L 24/33 |
| 2021/0111162 A1* | 4/2021 | Takeya ................... H01L 33/38 |
| 2021/0151648 A1* | 5/2021 | Hin ..................... H01L 21/6835 |
| 2021/0217740 A1* | 7/2021 | Lee ......................... H01L 33/62 |
| 2021/0375833 A1* | 12/2021 | Lee ..................... H01L 33/0095 |

FOREIGN PATENT DOCUMENTS

| | | |
|---|---|---|
| EP | 3770963 | 1/2021 |
| JP | 2013-182853 A | 9/2013 |
| JP | 2014122929 | 7/2014 |
| JP | 2018087927 | 6/2018 |
| JP | 2019016766 | 1/2019 |
| KR | 20170050365 | 5/2017 |
| KR | 20190120182 | 10/2019 |
| WO | 2019/045549 | 3/2019 |

OTHER PUBLICATIONS

International Search Report dated Mar. 24, 2021 in International Application No. PCT/KR2020/017453.
Non-Final Office Action dated Aug. 23, 2022, in U.S. Appl. No. 17/108,981.
Final Office Action dated Jan. 27, 2023, in U.S. Appl. No. 17/108,981.
Notice of Allowance dated Apr. 7, 2023, in U.S. Appl. No. 17/108,981.
Office Action dated Sep. 30, 2024, issued in corresponding Japanese patent application No. 2022-533189.
Office Action mailed Oct. 30, 2024 in Chinese Application No. 202080083289.1 filed Dec. 2, 2020 (w/English translation).

* cited by examiner

DISPLAY APPARATUS

CROSS REFERENCE TO RELATED APPLICATIONS

This application is a Continuation of U.S. patent application Ser. No. 17/108,981, filed on Dec. 1, 2020, which claims the benefit of U.S. Provisional Patent Application No. 62/942,567, filed on Dec. 2, 2019, each of which is hereby incorporated by reference for all purposes as if fully set forth herein.

BACKGROUND

Field

Exemplary embodiments of the invention relate generally to a display apparatus and, more specifically, to a large-area multi-module display apparatus.

Discussion of the Background

In recent years, a display apparatus employing light emitting diodes (LEDs) has been developed. The display apparatus employing light emitting diodes may be manufactured by forming structures of individually grown red (R), green (G), and blue (B) light emitting diodes (LEDs) on a final substrate.

There are increasing needs for a display apparatus having various areas, particularly a large area, in addition to a high resolution full-color display apparatus.

The above information disclosed in this Background section is only for understanding of the background of the inventive concepts, and, therefore, it may contain information that does not constitute prior art.

SUMMARY

Devices constructed according to exemplary embodiments of the invention are capable of providing a high quality large-area multi-module display apparatus and a method of manufacturing the same.

Additional features of the inventive concepts will be set forth in the description which follows, and in part will be apparent from the description, or may be learned by practice of the inventive concepts.

A display apparatus according to an exemplary embodiment includes a plurality of display modules each including a module substrate and a plurality of light emitting devices mounted on the module substrate, and a support substrate on which the display modules are disposed and including a plurality of electrodes, in which the module substrate includes through-holes penetrating the module substrate and vias disposed in the through-holes, and the light emitting devices are electrically connected to the electrodes of the support substrate through the vias.

Each of the vias may include an upper pad disposed on an upper surface of the module substrate, a lower pad disposed on a lower surface of the module substrate, and an inner electrode disposed in the through-hole, and the lower pad is connected to the support substrate by a ball grid array (BGA).

The display apparatus may further include a plurality of connectors disposed on a lower surface of the module substrate, in which the connectors may be electrically connected to the electrodes on the support substrate.

The module substrate may include a plurality of recesses formed on the lower surface thereof, and the connectors are disposed in the recesses.

The module substrate may have a pixel region in which the light emitting devices are disposed to display an image and a non-pixel region surrounding the pixel region, and at least some of the connectors may be disposed in the pixel region.

At least some of the through-holes may be disposed in the pixel region.

At least some of the through-holes may be disposed in a region corresponding to the recesses.

The support substrate may have protrusions disposed on a surface thereof facing the module substrate and corresponding to the recesses.

The protrusions may include a conductive material and may be electrically connected to the electrodes on the support substrate.

The support substrate may include a conductive electrode portion formed on a first surface thereof facing the module substrate, and the vias may contact the conductive electrode portion.

The support substrate may have holes disposed on the first surface and corresponding to the through-holes, and the vias may be integrally formed with the through-holes and the holes to contact the conductive electrode portion.

The through-holes may be disposed along an edge of the module substrate.

A method of manufacturing a display apparatus according to another exemplary embodiment includes manufacturing a plurality of display modules, and disposing the display modules on a support substrate, in which manufacturing each of the display modules includes forming light emitting devices on a module substrate, forming through-holes in the module substrate, and forming a drive circuit unit on a lower surface of the module substrate, and electrically connecting the light emitting devices to the drive circuit unit through the through-holes.

The through-holes may be formed using laser beams.

The method may further include grinding an edge of the module substrate on which the light emitting devices are formed.

The method may further include forming a plurality of recesses on the lower surface of the module substrate by laser processing.

The method may further include forming connectors in the recesses.

The method may further include forming protrusions at locations on the support substrate corresponding to the recesses.

The method may further include forming grooves at locations on an upper surface of the support substrate corresponding to the through-holes, and forming vias in the through-holes and the grooves.

The display modules may be disposed on the support substrate by a ball grid array (BGA).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
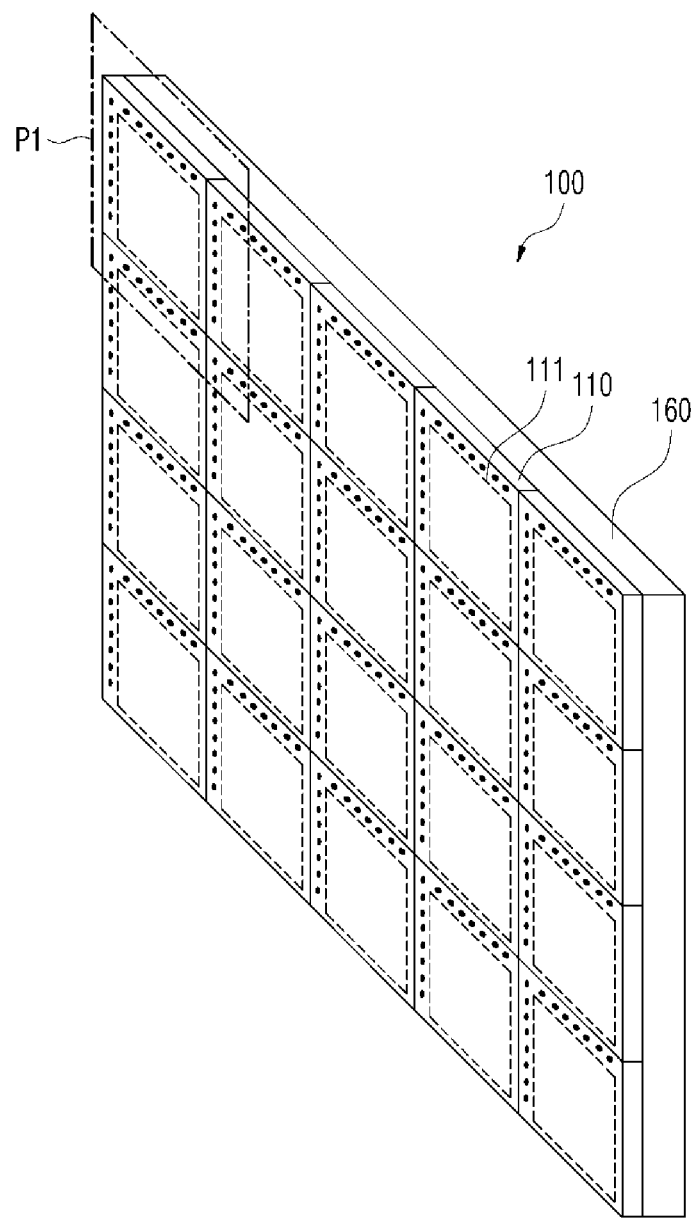
FIG. 1 is a schematic perspective view of a display apparatus according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments relate to a display apparatus including pixels. In the display apparatus according to exemplary embodiments, light emitting devices may be used for pixels that display an image. The display apparatus may include televisions, tablets, e-book display apparatuses, computer monitors, kiosks, digital cameras, game consoles, mobile phones, PDAs, and large outdoor/indoor electronic displays.

A display apparatus according to an exemplary embodiment includes micro-light emitting devices. The micro-light emitting devices may have a width or length of about 1 micrometer to about 800 micrometers, or about 1 micrometer to about 500 micrometers, or about micrometers to about 300 micrometers. However, the inventive concepts are not limited to a particular dimension of the micro-light emitting device, and the micro-light emitting devices in other exemplary embodiments may have a size smaller or larger than the above ranges. Hereinafter, micro-light emitting devices will be referred to as "light emitting devices".

Figure 2A:
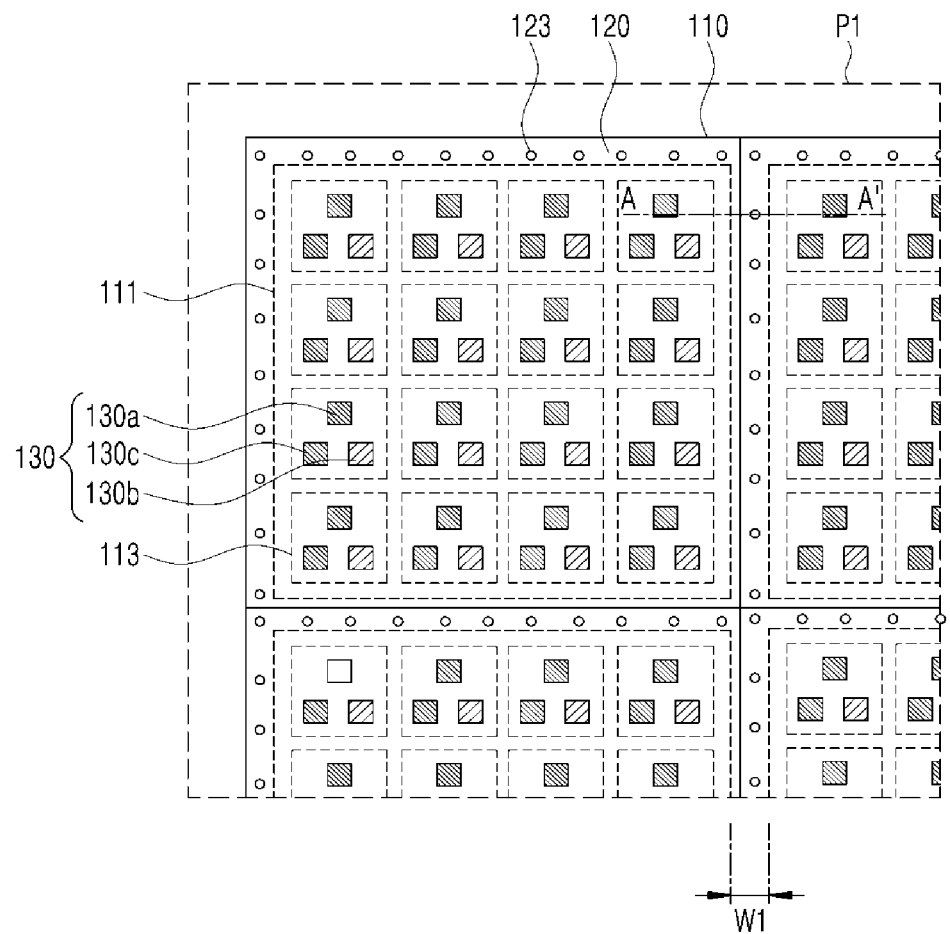
FIG. 2A is an enlarged plan view of P1 of FIG. 1.

FIG. 1 is a schematic perspective view of a display apparatus according to an exemplary embodiment. FIG. 2A is an enlarged plan view of P1 of FIG. 1, and FIG. 2B is a cross-sectional view taken along line A-A' of FIG. 2A.

Figure 2B:
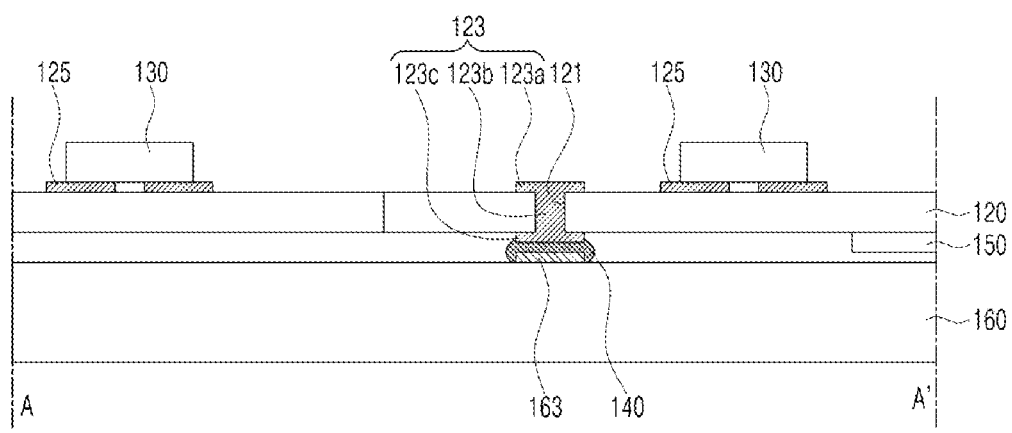
FIG. 2B is a cross-sectional view taken along line A-A' of FIG. 2A.

Referring to FIG. 1, FIG. 2A, and FIG. 2B, a display apparatus 100 according to an exemplary embodiment includes a support substrate 160 and multiple display modules 110 disposed on the support substrate 160. Each of the display modules 110 has a pixel region 111 in which an image is displayed, and may be disposed along columns and rows on the support substrate 160. The display module 110 may be formed with at least one pixel, preferably multiple pixels, in the pixel region 111.

The support substrate 160 may be formed with an interconnect portion and light emitting devices 130, and may be robust or flexible. The support substrate 160 may have a larger area than individual display modules 110, whereby the multiple display modules 110 can be mounted on the support substrate 160. According to the illustrated exemplary embodiment, the display apparatus 100 may be provided as a large display screen through combination of the multiple display modules 110.

Each of the display modules 110 includes a module substrate 120 and multiple light emitting devices 130 mounted on an upper surface of the module substrate 120.

The module substrate 120 of each of the display modules 110 may include various materials. For example, the module substrate 120 may be formed of a light transmissive insulating material. As used herein, the module substrate 120 having "light transmittance" means a module substrate 120 that is transparent to allow transmission of all fractions of light therethrough, as well as a module substrate 120 that is translucent or partially transparent to allow light having a certain wavelength or some fractions of light having a certain wavelength to pass therethrough. The module substrate 120 may include glass, quartz, organic polymer resins, organic/inorganic composites, and the like. However, the inventive concepts are not limited to a particular material of the module substrate 120 as long as the module substrate 120 has light transmittance and insulating properties.

The module substrate 120 includes at least one pixel region 111 and a non-pixel region surrounding the pixel region 111. The pixel region 111 refers to a region in which a pixel is disposed, and to which light emitted from the light emitting device 130 travels to be viewed by a user. The non-pixel region refers to a region excluding the pixel region 111. The non-pixel region is disposed at one or more sides of the pixel region 111. In the illustrated exemplary embodiment, the non-pixel region surrounds the pixel region 111.

The pixel region 111 is provided with at least one light emitting device 130. According to an exemplary embodiment, the pixel region 111 is provided with multiple light emitting devices 130.

A pixel unit 113 refers to the smallest unit displaying an image. Each pixel unit 113 may emit white light and/or light of a certain color. Each pixel unit 113 may include one pixel emitting one color, or may include multiple pixels different from each other to emit white light and/or light of a certain color through combination of different colors. For example, each of the pixel unit 113 may include first to third pixels.

The pixels are disposed in the pixel region 111 on the module substrate 120. The pixel unit 113 of each of the display modules 110 is provided with at least one pixel. For example, each of the pixel units 113 may include first to third pixels as described above. The first to third pixels may be realized by first to third light emitting devices 130a, 130b, 130c. More particularly, when light emitted from the first to third pixels is referred to as first to third light, the first to third light may have different wavelength bands. In an exemplary embodiment, the first to third light may correspond to blue, red, and green wavelength bands, respectively. However, the wavelength bands of light emitted from the pixels included in the display module 110 are not limited thereto, and may correspond to cyan, magenta, and yellow wavelength bands, respectively, in some exemplary embodiments.

The light emitting devices 130 may be provided to each of the pixels to emit light having various wavelengths. In an exemplary embodiment, the light emitting devices 130 may include first to third light emitting devices 130a, 130b, 130c, which emit green, red, and blue light as the first to third light, respectively. In this case, the first to third light emitting devices 130a, 130b, 130c may be realized by a blue light emitting diode, a red light emitting diode, and a green light emitting diode, respectively. However, the first to third light may have wavelength bands other than blue, red, and green light in order to realize a blue color, a red color, and a green color. For example, even when the first to third light has the same wavelength band, a final color of emission light may be controlled using a light conversion layer adapted to convert at least some of the first to third light into light having different wavelength bands than the first to third light. The light conversion layer may include materials, such as phosphors and quantum dots, which can convert light having a certain wavelength into light having a different wavelength. As such, in order to realize the first to third pixels that emit a green color, a red color and/or a blue color, respectively, the light emitting devices may not necessarily employ the blue light emitting diode, the red light emitting diode, and the green light emitting diode, but may employ other light emitting diodes. For example, although a red light emitting diode may be used to realize a red color, the light conversion layer adapted to emit red light through absorption of blue light or UV light may be used together with a blue or UV light emitting diode.

The light emitting devices 130 are formed in minute sizes and thus can be mounted on a flexible module substrate, such as a plastic substrate, through a transfer process. The light emitting devices 130 according to an exemplary embodiment may be inorganic light emitting devices, which may be formed through thin film growth of inorganic materials, unlike organic light emitting devices. As such, the light emitting devices 130 may be manufactured at high yield through a simple process. Further, individually singularized light emitting diodes 130 can be simultaneously transferred to a large substrate, thereby facilitating manufacture of a large-area display apparatus. Furthermore, the light emitting devices formed of the inorganic materials have advantages over organic light emitting devices, such as higher brightness, longer lifespan, and lower prices.

The module substrate 120 may be provided on an upper surface thereof with the interconnect portion, which may include multiple wires (data lines and/or scan lines described below). In an exemplary embodiment, the module substrate 120 may be provided on a lower surface thereof with an interconnection portion including multiple wires. The interconnect portion may be disposed in the pixel region 111 and the non-pixel region.

The wires formed on the lower surface of the module substrate 120 may be connected to a separate drive circuit unit 150. The drive circuit unit 150 may be manufactured as a separate printed circuit board, and may be disposed on the lower surface of the module substrate 120 to be connected to the wires on the lower surface of the module substrate 120. The wires on the upper surface of the module substrate 120 may be connected to the wires on the lower surface of the module substrate 120 via through-holes 121, which will be described in detail below.

In an exemplary embodiment, the module substrate 120 may be formed not only with the multiple wires but also drive devices for driving the light emitting devices 130. In the illustrated exemplary embodiment, the drive devices may be thin film transistors, each of which may be connected to the corresponding light emitting device 130 to turn on or off the light emitting device 130 in response to a drive signal from the outside.

As the first to third light emitting devices 130a, 130b, 130c, various types of light emitting diodes may be employed.

Figure 3:
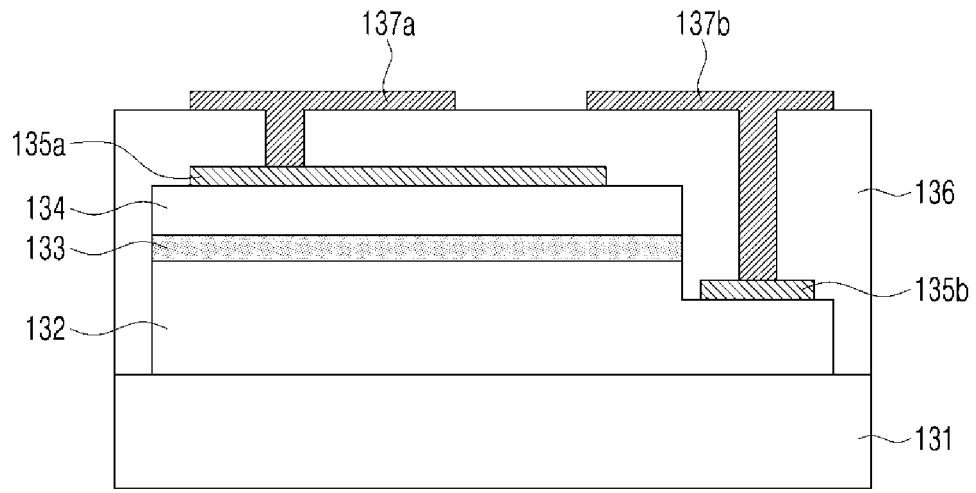
FIG. 3 is a schematic cross-sectional view of a light emitting device according to an exemplary embodiment.

FIG. 3 is a schematic cross-sectional view of the light emitting device 130 according to an exemplary embodiment. The light emitting device 130 shown in FIG. 3 may be one of the first to third light emitting devices 130a, 130b, 130c.

Referring to FIG. 3, the light emitting device includes a device substrate 131, a first semiconductor layer 132, an active layer 133, a second semiconductor layer 134, a first contact electrode 135a, a second contact electrode 135b, an insulating layer 136, a first contact pad 137a, and a second contact pad 137b.

In an exemplary embodiment, when the light emitting device emits green light, the first semiconductor layer 132, the active layer 133, and the second semiconductor layer 134 may include indium gallium nitride (InGaN), gallium nitride (GaN), aluminum indium gallium nitride (AlInGaN), gallium phosphide (GaP), aluminum gallium indium phosphide (AlGaInP), and aluminum gallium phosphide (AlGaP). When the light emitting device emits red light, the first semiconductor layer 132, the active layer 133, and the second semiconductor layer 134 may include aluminum gallium arsenide (AlGaAs), gallium arsenide phosphide (GaAsP), aluminum gallium indium phosphide (AlGaInP), and gallium phosphide (GaP). When the light emitting device emits blue light, the first semiconductor layer 132, the active layer 133, and the second semiconductor layer 134 may include gallium nitride (GaN), indium gallium nitride (InGaN), aluminum indium gallium nitride (AlInGaN), and zinc selenide (ZnSe).

The first and second semiconductor layers 132, 134 may be doped with different types of dopants, respectively, and may be an n-type semiconductor layer or a p-type semiconductor layer depending upon the type of dopant. For example, the first semiconductor layer 132 may be an n-type semiconductor layer and the second semiconductor layer 134 may be a p-type semiconductor layer. Alternatively, the first semiconductor layer 132 may be a p-type semiconductor layer and the second semiconductor layer 134 may be an n-type semiconductor layer.

Although each of the first semiconductor layer 132 and the second semiconductor layer 134 is exemplarily illustrated as a single layer in the drawings, each of the first semiconductor layer 132 and the second semiconductor layer 134 may be multiple layers and may include a superlattice layer in other exemplary embodiments. The active layer 133 may have a single quantum well structure or a multi-quantum well structure, and the composition of nitride semiconductors for the active layer 133 may be adjusted to emit light having a desired wavelength.

The first contact electrode 135a is disposed on the second semiconductor layer 134, and the second contact electrode 135b is disposed on the first semiconductor layer 132, on which the active layer 133 and the second semiconductor layer 134 are not disposed.

The first contact electrode 135a and/or the second contact electrode 135b may be formed as a single layer or multiple layers. The first contact electrode 135a and/or the second contact electrode 135b may be formed of various metals, such as Al, Ti, Cr, Ni, Au, Ag, Cu, and the like, and an alloy thereof.

The insulating layer 136 is provided on the first and second contact electrodes 135a, 135b, and the first and second contact pads 137a, 137b are disposed on the insulating layer 136 to be connected to the first contact electrode 135a and the second contact electrodes 135b through contact holes, respectively. In the illustrated exemplary embodiment, the first contact pad 137a is connected to the first contact electrode 135a and the second contact pad 137b is connected to the second contact electrode 135b. However, the inventive concepts are not limited thereto. For example, in some exemplary embodiments, the second contact pad 137b may be connected to the first contact electrode 135a and the first contact pad 137a may be connected to the second contact electrode 135b.

The first contact pad 137a and/or the second contact pad 137b may be formed as a single layer or multiple layers. The first contact pad 137a and/or the second contact pad 137b may be formed of metal, such as Al, Ti, Cr, Ni, Au, and the like, and an alloy thereof, or transparent conductive oxide, such as indium tin oxide (ITO), ZnO, or others.

The light emitting device 130 may further include additional functional layers in addition to the aforementioned layers. For example, the light emitting device 130 may further include a reflective layer for reflection of light, an additional insulating layer for insulation of a specific component, an anti-solder layer for preventing diffusion of solders, and the like.

Although the light emitting device 130 is exemplarily illustrated as including the first and second contact pads 137a, 137b facing in an upward direction in FIG. 3, the light emitting device 130 in other exemplary embodiments may be mounted on the module substrate after being flipped upside down, such that the first and second contact pads 137a, 137b face the upper surface of the module substrate. The first and second contact pads 137a, 137b may be directly electrically connected to the interconnect portion on the module substrate, or through a conductive bonding member.

Referring back to FIG. 1, FIG. 2A, and FIG. 2B, in the display apparatus 100 according to the illustrated exemplary embodiment, the light emitting devices 130 are turned on to emit light when a common voltage and data signals are applied thereto, and the light emitted from the light emitting devices 130 travels towards the lower surface of the module substrate 120 through the module substrate 120 disposed under the light emitting devices 130.

In an exemplary embodiment, each of the display modules 110 is connected to the interconnect portion formed on the upper surface of the support substrate 160, particularly to a conductive electrode portion 163. Various kinds of interconnect portions and circuits (for example, various circuits for driving the pixels) may be formed on the support substrate 160, and drive signals may be provided to the light emitting devices 130 disposed on the display modules 110 through the conductive electrode portion 163. To this end, the module substrate 120 of the display module 110 is provided with a structure for connecting the conductive electrode portion 163 of the support substrate 160 to the interconnect portion 125 on the upper surface of the module substrate 120.

In an exemplary embodiment, each of the module substrates 120 has the through-holes 121 formed through the module substrate 120. The through-holes 121 may be disposed in the non-pixel region rather than in the pixel region 111, and thus, may be arranged along an edge of the module substrate 120. However, the inventive concepts are not limited thereto, and in some exemplary embodiments, the through-holes 121 may be disposed in the pixel region 111. The number of through-holes 121 may be set depending upon the number of light emitting devices 130 to be connected to the interconnect portion 125.

Each of the through-holes 121 is formed to penetrate both surfaces of the module substrate 120. Each of the through-holes 121 is formed with a via 123. Each of the vias 123 includes an upper pad 123a formed on the upper surface of the module substrate 120, a lower pad 123c formed on the lower surface of the module substrate 120, and an inner electrode 123b corresponding to the interior of the through-hole 121 and connecting the upper pad 123a to the lower pad 123c. The upper pad 123a may be connected to the interconnect portion 125 formed on the upper surface of the module substrate 120, and the lower pad 123c may be connected to the interconnect portion 125 formed on the lower surface of the module substrate 120 or to the conductive electrode portion 163 of the support substrate 160.

In the illustrated exemplary embodiment, the drive circuit unit 150 is separately formed on the lower surface of the module substrate 120 to drive the light emitting devices 130, and thus, the lower pad 123c is connected to the drive circuit unit 150 through the interconnect portion 125 formed on the lower surface of the module substrate 120.

Figure 4:
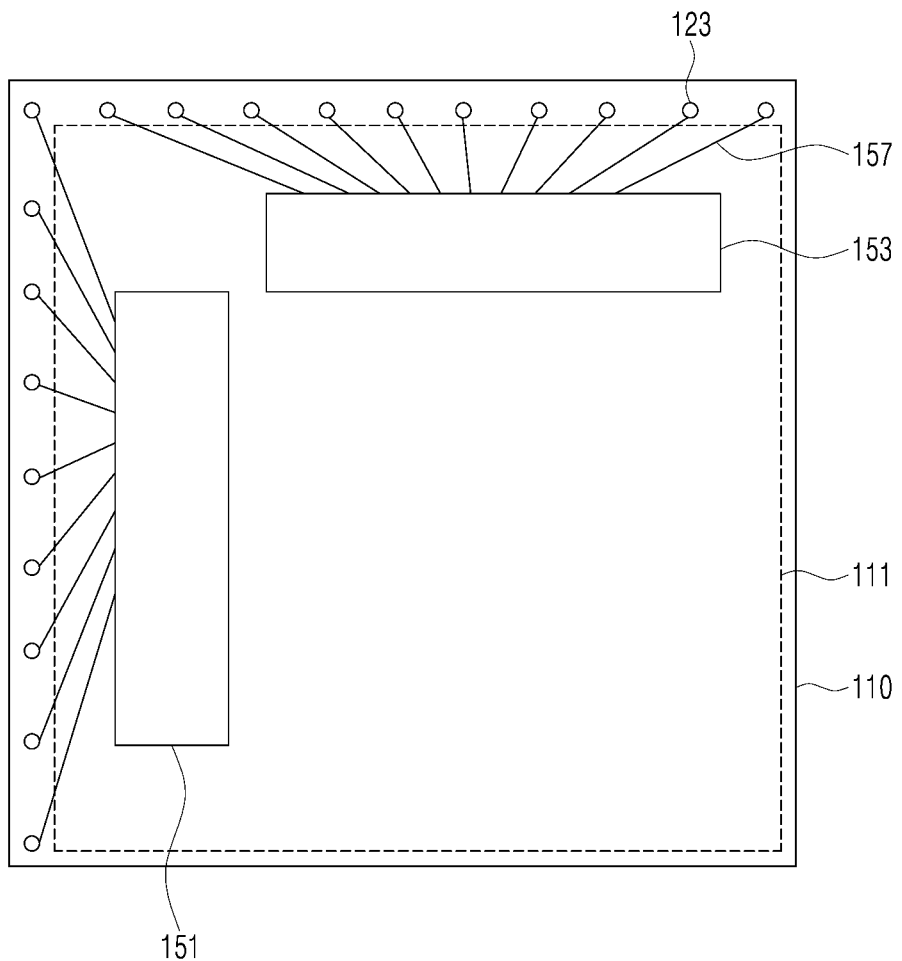
FIG. 4 is a schematic plan view of a display apparatus according to an exemplary embodiment, in which a drive circuit unit is separately disposed on a lower surface of a module substrate of the display apparatus.

FIG. 4 is a schematic plan view of a display apparatus according to an exemplary embodiment, in which the drive circuit unit 150 is separately disposed on the lower surface of the module substrate 120 of the display apparatus 100.

Referring to FIG. 1 to FIG. 4, the drive circuit unit 150 may be provided singularly or in plural as shown in the drawings. For example, the drive circuit unit 150 may include a first drive circuit unit 151 and a second drive circuit unit 153. The first and second drive circuit units 151, 153 are electrically connected to the lower pads 123c of the vias 123 through the interconnect portion 125 formed on the lower surface of the module substrate 120. The first drive circuit unit 151 and the second drive circuit unit 153 may be, for example, a scan driver and a data driver, respectively. The first drive circuit unit 151 and the second drive circuit unit 153 may be disposed in regions corresponding to the pixel region 111 and/or the non-pixel region.

When the drive circuit unit 150 is not separately disposed on the lower surface of the module substrate 120, or when the drive circuit unit 150 requires a connection to an additional device, the lower pad 123c may be connected to the conductive electrode portion 163 on the support substrate 160. The lower pad 123c may be connected to the conductive electrode portion 163 on the support substrate 160 through a conductive bonding member 140, such as solder pastes, disposed between the lower pad 123c and the conductive electrode portion 163. Alternatively, the lower pad 123c may be connected to the conductive electrode portion 163 of the support substrate 160 by a ball grid array. In this case, solder balls may be disposed between the lower pad 123c and the conductive electrode portion 163 of the support substrate 160.

The support substrate 160 may be provided with various devices, for example, a timing controller, a memory including EEPROM, circuits for driving the light emitting device 130, such as a voltage source and the like, and the interconnect portions including various wires electrically connected to the conductive electrode portion 163. The support substrate 160 may be formed with a gate driver and a data driver, which supply scan signals and image signals to a scan line and a data line, respectively.

Drive signals output from the drive circuit unit 150 or from various devices on the support substrate 160 are sent to the light emitting devices 130 through the vias 123, such that the light emitting devices 130 can be turned on or off to display an image.

As such, the display apparatus 100 according to an exemplary embodiment may be provided as a multi-module display apparatus including multiple display modules 110. For example, FIG. 1 exemplarily shows the display apparatus 100 including 4×5 display modules 110.

According to an exemplary embodiment, each or at least some of the multiple display modules 110 may be independently driven, or at least some of the multiple display modules 110 may be dependently driven in association with the other multiple display modules 110. A single image may be displayed by driving the multiple display modules 110 in association with one another.

According to an exemplary embodiment, each of the multiple display modules 110 may have the same size. However, in some exemplary embodiments, at least one display module may have a different size from the remaining display modules. Further, at least one display module may include a different number of pixels from the remaining display modules, and thus, may have different resolution from the remaining display modules. Furthermore, when the same resolution is not required in all regions, the display apparatus 100 may be manufactured by arranging display modules having different resolutions.

In an exemplary embodiment, each of the display modules 110 may have a shape other than a rectangular shape. In particular, depending on the overall shape of the display apparatus 100, the display modules 110 may have a shape other than a rectangular shape. In addition, the number of support substrates 160 or the number of display modules 110 mounted on the support substrate 160 may be changed in various ways according to the size of the display apparatus 100 to be manufactured.

In this manner, division of the image or generation of dark lines on an image displayed on a screen of the display apparatus may be suppressed by minimizing separation of the pixel region between adjacent display modules when a large-area multi-module display apparatus is provided. According to an exemplary embodiment, the vias may be formed in the module substrate on which the light emitting devices are mounted, particularly in the non-pixel region directly adjacent to the pixel region or in the pixel region. Accordingly, a separate device may not be required on a side surface of the module substrate for connecting the display module to the support substrate, thereby minimizing a distance between two adjacent display modules by obviating a space for mounting the separate device on the side surface of the module substrate.

FIG. 5A to FIG. 5E are views illustrating a method of manufacturing the display apparatus according to an exemplary embodiment.

Referring to FIG. 5A to FIG. 5E, the display apparatus 100 according to an exemplary embodiment may be provided by manufacturing multiple display modules 110 and placing the multiple display modules 110 on a support substrate 160.

Figure 5A:
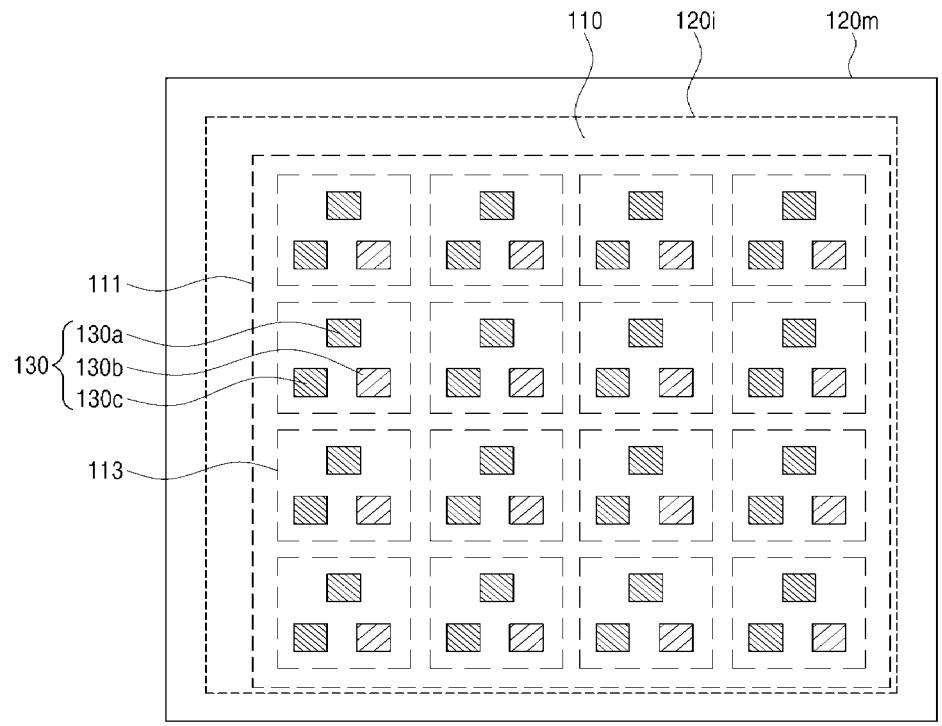
FIGS. 5A, 5B, 5C, 5D, and 5E are views illustrating a method of manufacturing a display apparatus according to an exemplary embodiment.

More particularly, a mother substrate 120m is prepared as shown in FIG. 5A. The mother substrate 120m may have the same size as or a larger size than the display module 110. The mother substrate 120m may be formed of a light transmissive insulating material. The mother substrate 120m may include a pixel region 111 in which light emitting devices 130 will be disposed and a non-pixel region surrounding the pixel region 111. The non-pixel region may extend beyond an imaginary line 120i corresponding to the size of the display module 110.

An interconnect portion 125 (see FIG. 2B) and the light emitting devices 130 are formed on the mother substrate 120m. The interconnect portion 125 may be formed by various methods, such as plating, photolithography, and the like. The light emitting devices 130 may be individually or simultaneously mounted on the mother substrate 120m by a transfer process.

Figure 5B:
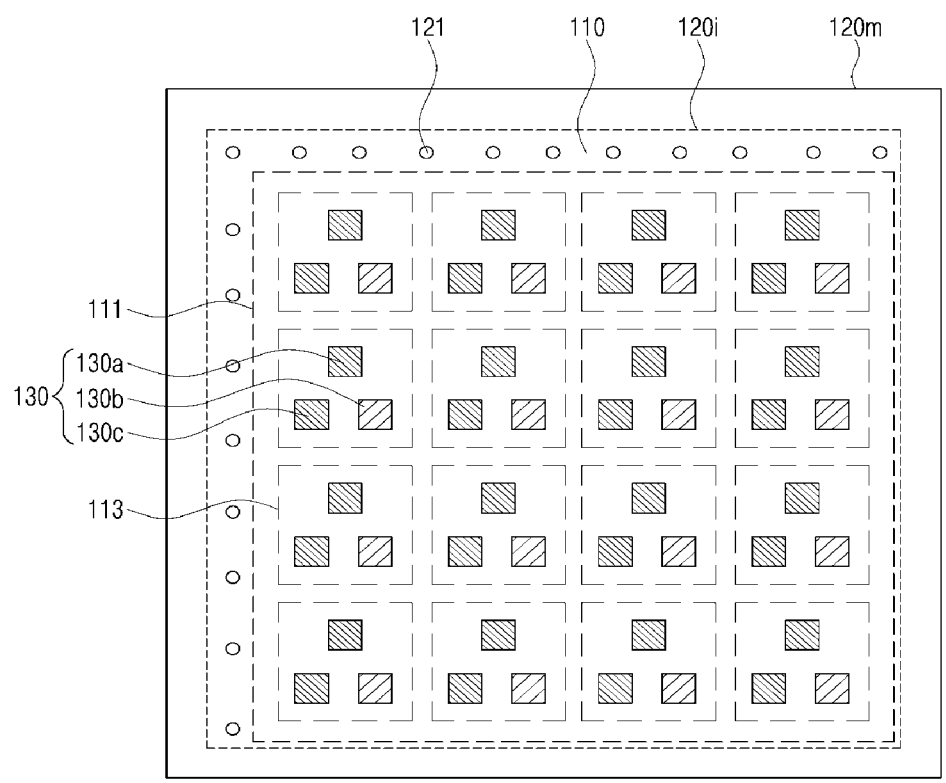

Referring to FIG. 5B, through-holes 121 are formed in the non-pixel region to penetrate upper and lower surfaces of the mother substrate 120m. The through-holes 121 may be formed by laser processing, without being limited thereto. For example, in another exemplary embodiment, vias may be formed in the mother substrate 120m having the through-holes 121 through plating or the like.

Figure 5C:
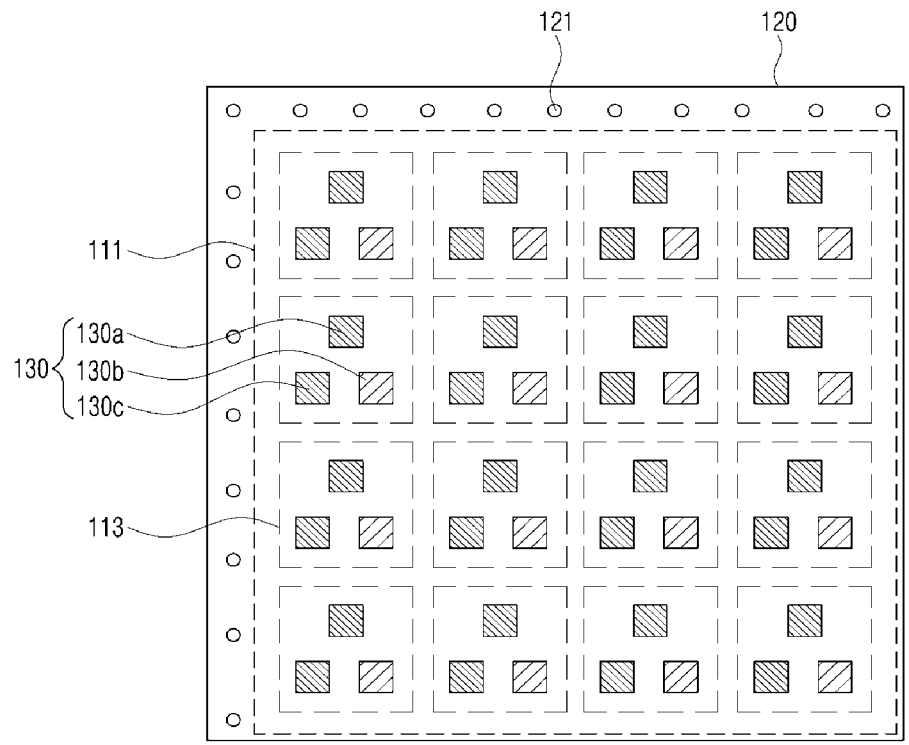

Referring to FIG. 5C, an edge of the mother substrate 120m may be cut or may be ground to the size of the display module to be manufactured, whereby each of the display modules 110 includes the module substrate 120 and the light emitting devices 130.

Figure 5D:
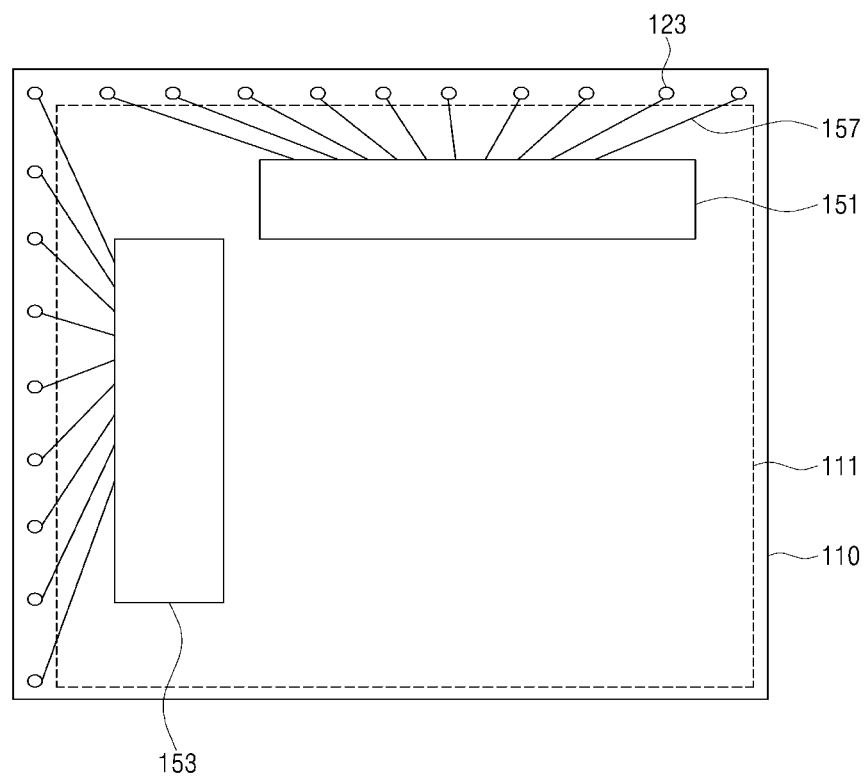

Referring to FIG. 5D, in some exemplary embodiments, a drive circuit unit may be disposed on a lower surface of the module substrate 120 and may be electrically connected to the light emitting devices 130 through the through-holes 121.

Figure 5E:
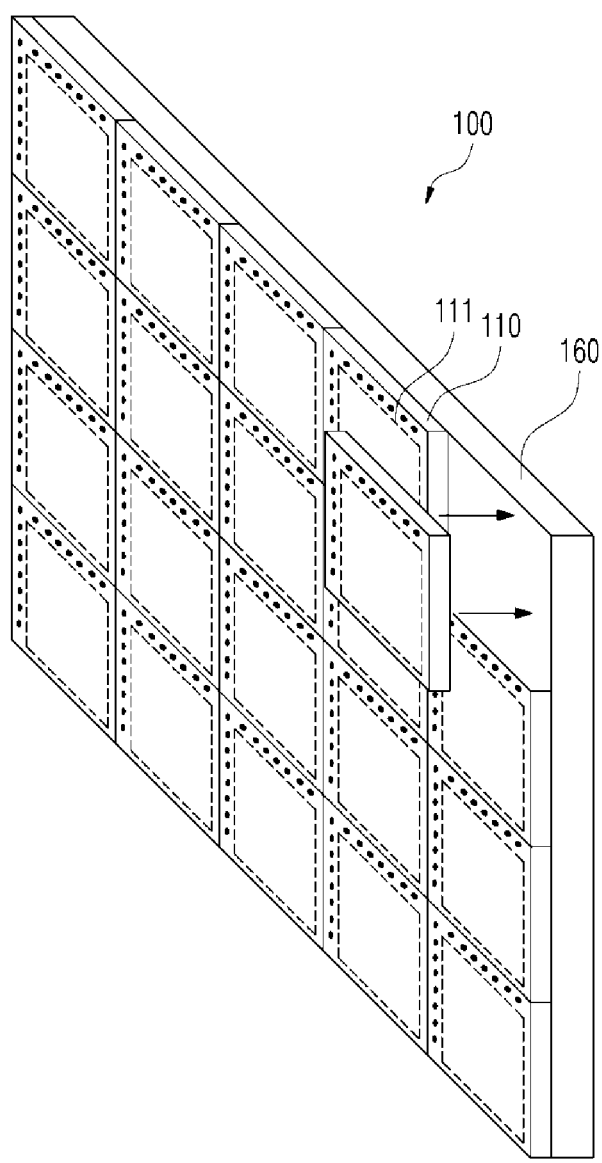

Next, referring to FIG. 5E, the display modules 110 are disposed on the support substrate 160, and are electrically connected to each other. The multiple modules 110 may be disposed along columns and rows on the support substrate 160. A conductive bonding agent, such as solder pastes or solder balls for a ball grid array, may be disposed between each of the display modules 110 and the support substrate 160 to electrically connect the display modules 110 to the support substrate 160.

As described above, each of the display modules is manufactured by forming the through-holes in the module substrate and forming the vias in the through-holes, followed by attaching the display modules to the support substrate through soldering or a ball grid array. In this manner, a multi-module display apparatus may be manufactured through an inexpensive and simple process.

In an exemplary embodiment, a connection structure between the display modules and the support substrate may be changed in various ways.

Figure 6:
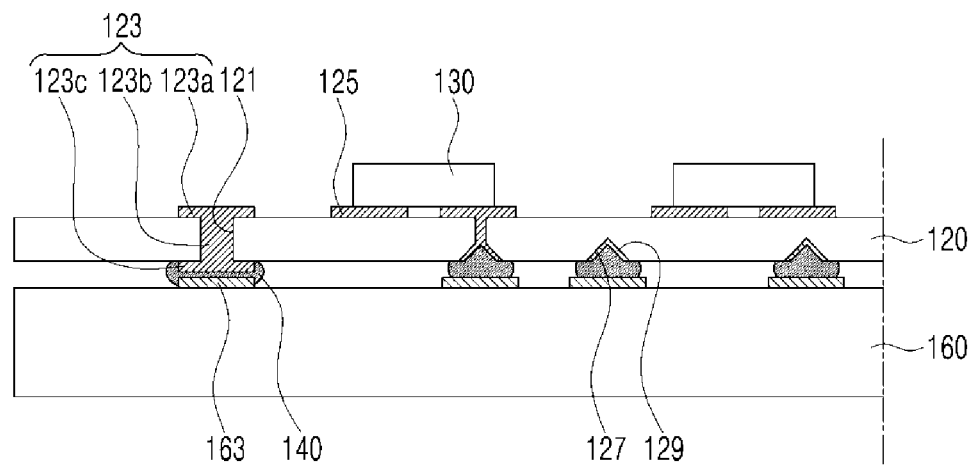
FIG. 6 is a cross-sectional view of a connection structure between a display module and a support substrate of a display apparatus according to an exemplary embodiment.
Figure 7:
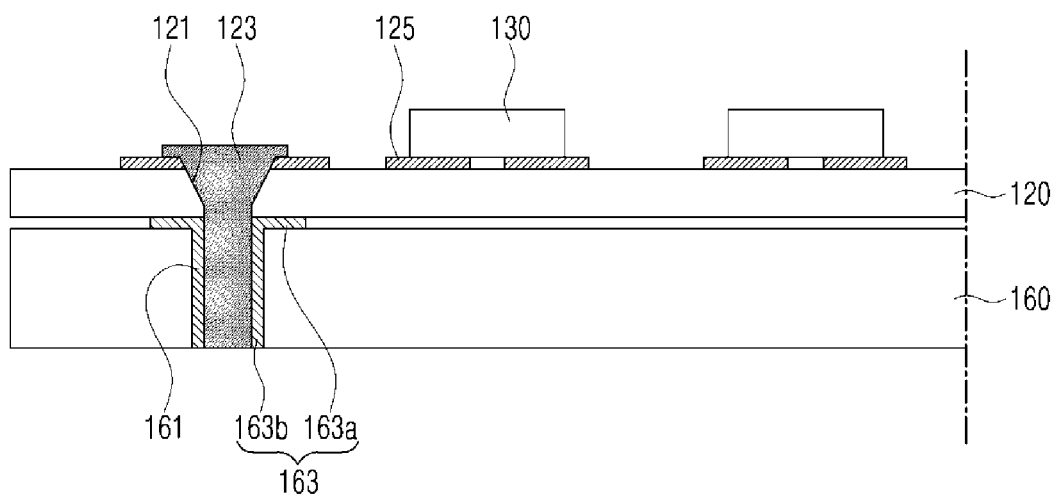
FIG. 7 is a cross-sectional view of a connection structure between a display module and a support substrate of a display apparatus according to another exemplary embodiment.

FIG. 6 and FIG. 7 are cross-sectional views of the connection structure between the display modules and the support substrate in the display apparatus according to exemplary embodiments. Since the connection structures shown in FIGS. 6 and 7 are similar to that shown in FIG. 2B, repeated descriptions of the elements or configuration thereof that have been already described above will be omitted or simplified to avoid redundancy.

Referring to FIG. 6, according to an exemplary embodiment, multiple recesses 127 may be formed on the lower surface of the module substrate 120. The recesses 127 may be formed by laser processing, for example.

As a part of the interconnect portion 125 formed on the lower surface of the module substrate 120, a connection wire 129 may be formed in each of the recesses 127. The recesses 127 may be formed in an inclined cross-sectional shape, without being limited thereto. The connection wire 129 may be formed in each of the recesses 127. The connection wire 129 may be easily formed inside the recess 127 by plating. Alternatively, the connection wire 129 may be formed inside the recess or in a region adjacent to the recess 127 by other methods known in the art other than plating.

The connection wires 129 may be connected to the drive circuit unit 150 disposed on the lower surface of the module substrate 120, or may be connected to the support substrate 160 facing the lower surface of the module substrate 120.

The conductive electrode portion 163 is formed in a region of the support substrate 160 facing a portion of the module substrate 120, on which the connection wires 129 are formed. Further, protrusions may be formed on the conductive electrode portion 163 of the support substrate 160 in regions corresponding to the recesses 127 having the connection wires 129 therein to be electrically connected to the recesses 127 by making a contact. The protrusions may include a conductive material. As such, when the protrusions contact the connection wires 129, the connection wires 129 may be electrically connected to the wires of the support substrate 160. The protrusions may be formed of any conductive material, for example, solder pastes, without being limited thereto.

In an exemplary embodiment, the connection wires 129 may be formed by plating and the like after the recesses 127 are formed, and the protrusions may be formed before connection between the connection wires 129 and the support substrate 160.

In the illustrated exemplary embodiment, some through-holes 121 may be disposed in the pixel region 111, and the via 123 may be formed in each of the through-holes 121. The vias 123 may be disposed in the pixel region 111, and some vias 123 may be disposed to overlap light emitting devices 130. For example, the vias 123 may be disposed in regions in which first and second contact pads of the light emitting devices 130 are formed.

Accordingly, the first and second contact pads of the light emitting devices 130 may be connected to the connection wires 129 disposed on the lower surface of the module substrate 120 by the vias 123 in the pixel region 111. In some exemplary embodiments, the through-holes 121 and the vias 123 may be formed in the non-pixel region rather than in the pixel region 111, and some of the through-holes 121 and the vias 123 may be formed in regions corresponding to the recesses 127 in the pixel region 111.

Referring to FIG. 7, the support substrate 160 is disposed to face the module substrate 120, and has a hole 161 corresponding to each of the through-holes 121. The via 123 may be integrally formed with the through-hole 121 and the hole 161 to contact the conductive electrode portion 163. The support substrate 160 may have a side portion 163*b* and an upper surface portion 163*a* to facilitate electrical contact with the via 123.

In the illustrated exemplary embodiment, the holes 161 are formed at locations of the support substrate 160 corresponding to the through-holes 121, and then the vias 123 may be formed in the through-holes 121 and the holes 161 of the support substrate 160. Each via 123 may be formed by filling the through-hole 121 and the hole 161 of the support substrate 160 with a conductive material. Alternatively, the via 123 may be formed using a separate material and inserted into the through-hole 121 and the hole 161 of the support substrate 160.

Figure 8:
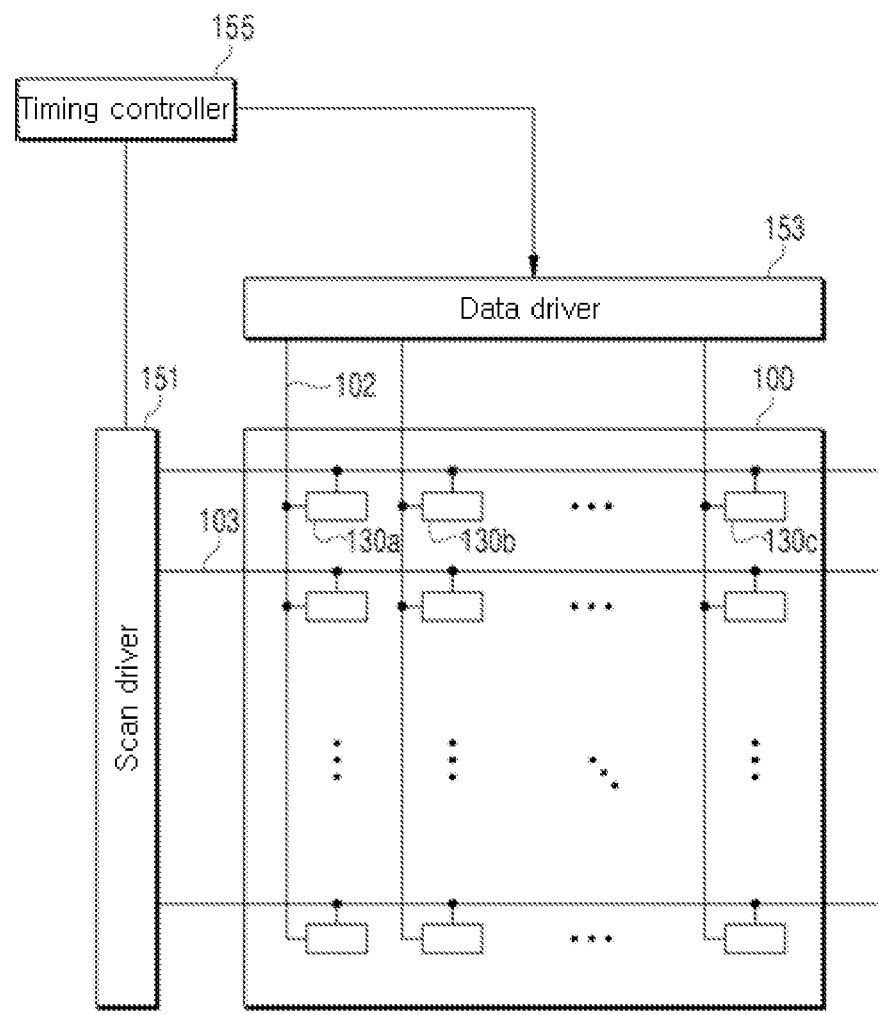
FIG. 8 is a structural view of a display apparatus according to an exemplary embodiment.

FIG. 8 is a structural view of a display apparatus according to an exemplary embodiment.

Referring to FIG. 8, the display apparatus according to an exemplary embodiment includes a timing controller 155, a first driver 151, a second driver 153, an interconnect portion, and pixels including the first to third light emitting devices 130*a*, 130*b*, 130*c*. The first driver 151 and the second driver 153 may be a scan driver and a data driver, respectively, and will hereinafter be referred to as the scan driver and the data driver, respectively.

Each of the pixels is individually connected to the scan driver 151 and the data driver 153 through the interconnect portion.

The timing controller 155 receives image data and various control signals for driving the display apparatus from the outside, such as from a system that transmits the image data. Then, the timing controller 155 sends the image data to the data driver 153 after rearrangement of the received image data. In addition, the timing controller 155 generates scan control signals and data control signals for driving the scan driver 151 and the data driver 153, and sends the scan control signals and the data control signals to the scan driver 151 and the data driver 153, respectively.

The scan driver 151 receives the scan control signals sent from the timing controller 155, and generates scan signals corresponding thereto.

The data driver 153 receives the data control signals and the image data sent from the timing controller 155, and generates data signals corresponding thereto.

The interconnect portion includes multiple signal wires. In particular, the interconnect portion includes first wires 103, which connect the scan driver 151 to the pixels, and second wires 102, which connect the data driver 153 to the pixels. The first wires 103 may be scan lines and the second wires 102 may be data lines. The connecting portion may further include wires that connect the timing controller 155 to the scan driver 151, the data driver 153, and other components.

The scan signals generated by the scan driver 151 are sent to the pixels through the scan lines 103. The data signals generated by the data driver 153 are sent to the data lines 102. The data signals sent to the data lines 102 are input to the pixels selected by the scan signals.

The pixels are connected to the scan lines 103 and the data lines 102. The pixels selectively emit light in response to the data signals input through the data lines 102 when the scan signals are supplied to the pixels from the scan lines 103. For example, in each frame period, each of the pixels emits light at brightness corresponding to the data signal input thereto. In response to data signals corresponding to black brightness, the pixels do not emit light to implement a black mode for the corresponding frame period.

In an exemplary embodiment, the pixels may be driven in a passive manner or in an active manner. When the display apparatus driven in the active manner, first and second pixel power may be further provided to drive the display apparatus together with the scan signal and data signal.

The light emitting devices may be arranged in various shapes in the pixel region to form a pixel unit.

Figure 9:
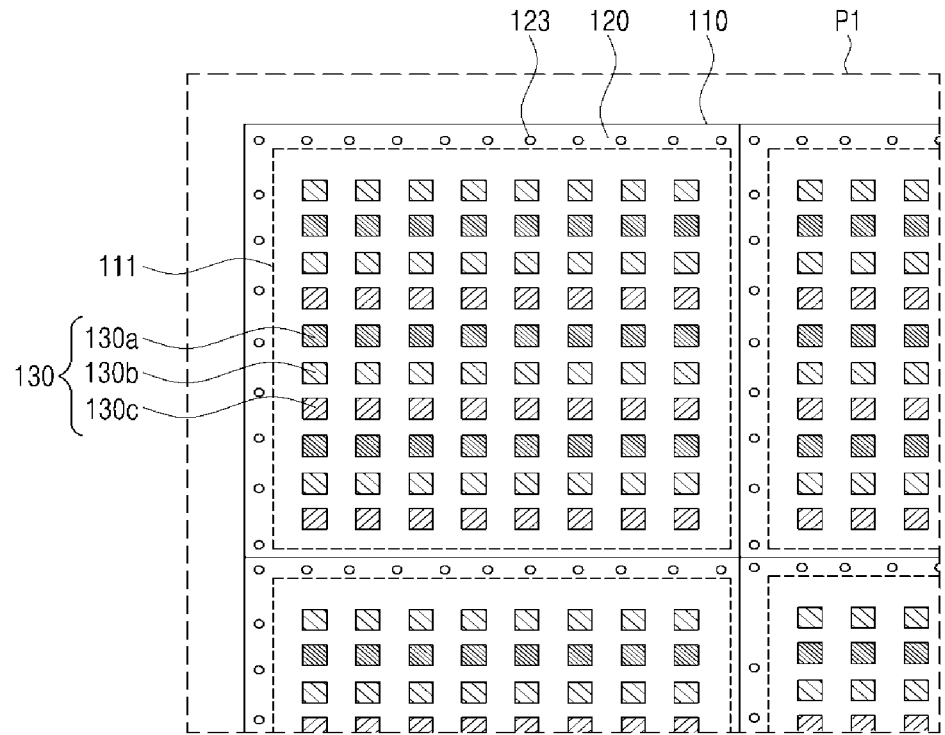
FIG. 9 is an enlarged plan view of P1 of FIG. 1 according to another exemplary embodiment.

FIG. 9 is an enlarged plan view of P1 of FIG. 1 according to another exemplary embodiment.

Referring to FIG. 9, the pixel region 111 of the module substrate 120 may be provided with the multiple light emitting devices 130. The multiple light emitting devices 130 may be arranged in various shapes to form a pixel unit. In the pixel unit of FIG. 2A, the first to third light emitting devices 130*a*, 130*b*, 130*c* are arranged in a triangular shape. In the illustrated exemplary embodiment, multiple light emitting devices 130 may be arranged in the pixel unit in a matrix, as shown in FIG. 9. For example, the first to third light emitting devices 130*a*, 130*b*, 130*c* may be alternately arranged along columns or rows, or along both columns and rows as a pixel unit. As another example, the first light emitting devices, the second light emitting devices, and the third light emitting devices 130*a*, 130*b*, 130*c* may be sequentially repeated along columns or rows, or along both columns and rows as a pixel unit.

Figure 10A:
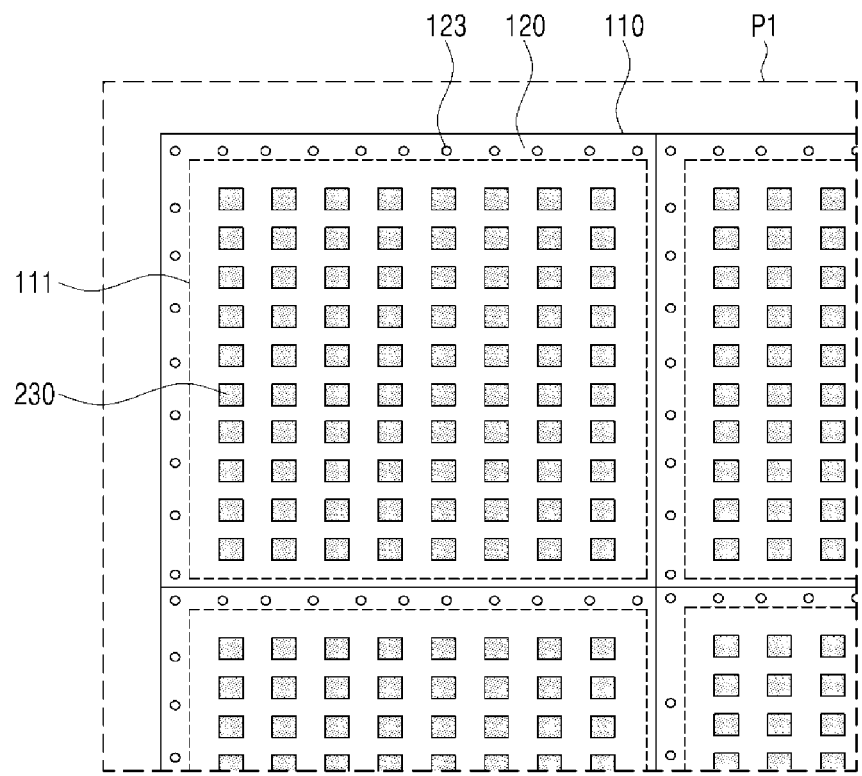
FIG. 10A is an enlarged plan view of P1 of FIG. 1 according to still another exemplary embodiment.
Figure 10B:
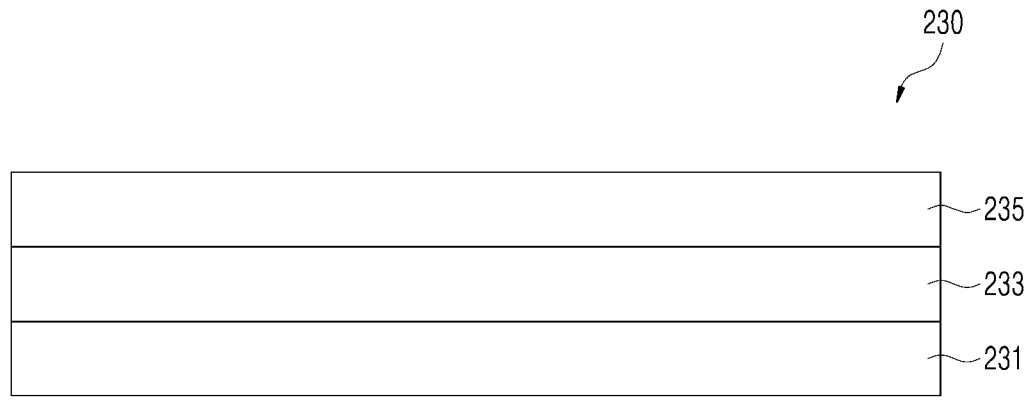
FIG. 10B is a schematic view of the light emitting device of FIG. 10A.

FIG. 10A is an enlarged plan view of P1 of FIG. 1 according to still another exemplary embodiment. FIG. 10B is a schematic cross-sectional view of the light emitting device shown in FIG. 10A.

Referring to FIG. 10A, the pixel region 111 of the module substrate 120 is provided with multiple light emitting devices 230, each of which may form a pixel unit. Each of the light emitting devices 230 may include multiple epitaxial stacks that emit light of different colors. For example, each of the light emitting devices 230 may include first to third epitaxial stacks 231, 233, 235 sequentially stacked one above another, as shown in FIG. 10B.

Each of the epitaxial stacks may emit light of a certain color in the visible spectrum. The first epitaxial stack 231 may emit light of a first color, the second epitaxial stack 233 may emit light of a second color, and the third epitaxial stack 235 may emit light of a third color. The first to third colors may be different colors from one another, and may have sequentially decreasing wavelengths in different wavelength bands. In particular, the first to third colors may have different short wavelength bands that have gradually increasing energy from the first color to the third color. For example, the first color may be red, the second color may be green, and the third color may be blue. However, the inventive concepts are not limited thereto, and the sequence of the first to third colors may be changed depending upon the lamination sequence of the first to third epitaxial stacks 231, 233, 235.

As described above, since one pixel unit may be formed by mounting one light emitting stack rather than using the multiple light emitting devices, more pixel units may be formed in a unit area and the manufacturing method thereof may be significantly simplified.

Figure 11:
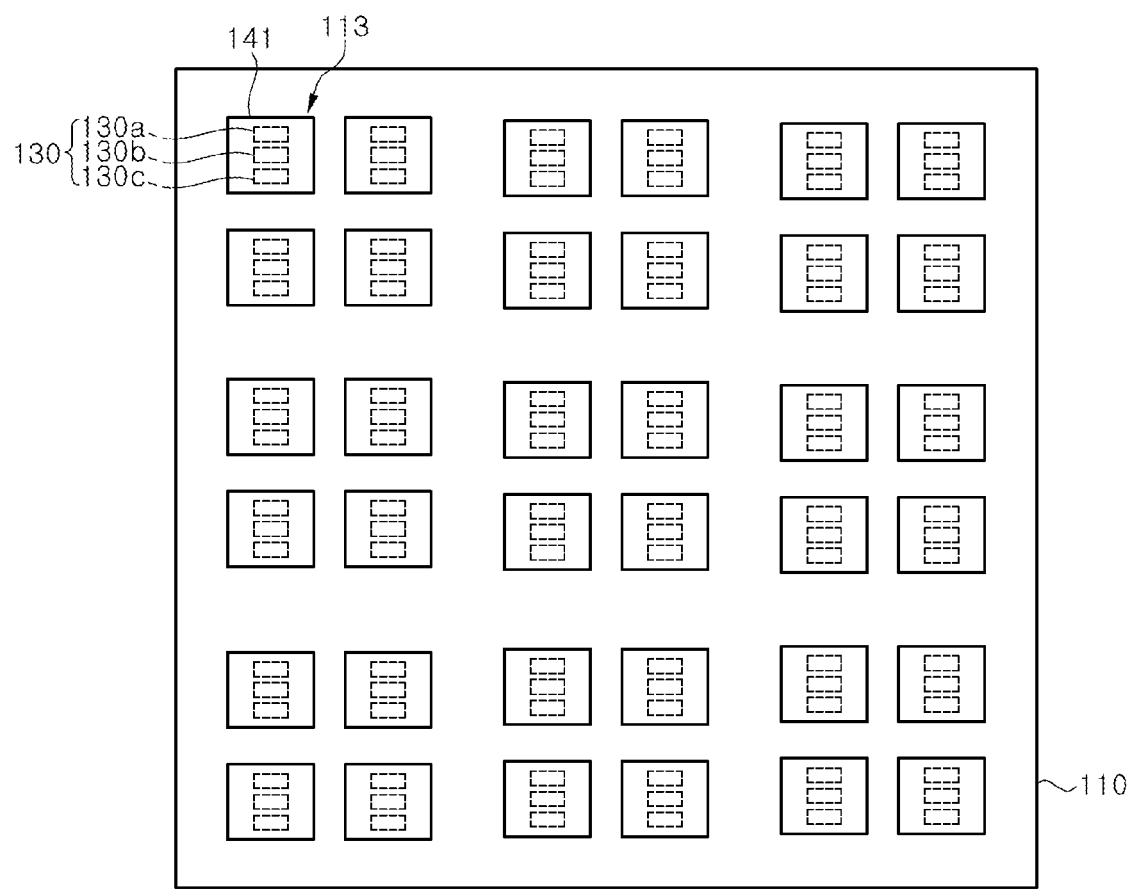
FIG. 11 is a schematic plan view of a display device according to an exemplary embodiment.

FIG. 11 is a schematic plan view of light emitting devices according to another exemplary embodiment.

Referring to FIG. 11, light emitting devices 130 (e.g., 130a, 130b, and 130c) are arranged on a display modules 110, as described in reference with FIG. 9. However, the light emitting devices 130a, 130b, and 130c according to the illustrated exemplary embodiment are disposed on an auxiliary substrate 141 to be arranged on the display module 110, and thus, the pixel unit 113 includes the auxiliary substrate 141. The auxiliary substrate 141 may be, for example, a sapphire substrate, without being limited thereto.

Exemplary embodiments provide a large-area display apparatus that minimizes division of an image or generation of a dark line on the image.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display module comprising:
   a light module comprising a module substrate and a plurality of light sources disposed on the module substrate; and
   a drive circuit electrically connected to the light module and configured to control the plurality of light sources,
   wherein the module substrate includes:
      an upper surface on which the plurality of light sources are disposed, and a lower surface opposing the upper surface;
      a plurality of first wires disposed on the upper surface;
      a plurality of second wires disposed on the lower surface;
      a first region comprising at least one of the plurality of first wires and at least one of the plurality of light sources;
      a second region disposed on the module substrate and surrounding the first region; and
      holes disposed in the module substrate and vias disposed in the holes,
   wherein at least one of the holes and vias is disposed on the second region,
   wherein at least one of the plurality of second wires is disposed on a region corresponding to the second region, and
   wherein at least one of the plurality of second wires is disposed on a region corresponding to the first region.

2. The display module of claim 1, wherein at least one of the plurality of first wires is disposed on a region corresponding to the first region.

3. The display module of claim 1, wherein at least one of the plurality of first wires is disposed on a region corresponding to the second region.

4. The display module of claim 1, wherein the holes and vias are disposed on the second region.

5. A display device comprising:
   a light module comprising a module substrate and a plurality of light sources disposed on the module substrate; and
   a drive circuit electrically connected to the light module and configured to control the plurality of light sources,
   wherein the module substrate includes:
      an upper surface on which the plurality of light sources are disposed, and a lower surface opposing the upper surface;
      a plurality of first wires disposed on the upper surface;
      a plurality of second wires disposed on the lower surface;
      a first region comprising at least one of the plurality of first wires and at least one of the plurality of light sources;
      a second region disposed on the module substrate and surrounding the first region; and
      holes disposed in the module substrate,
   wherein at least one of the plurality of second wires is disposed on a region corresponding to the second region, and
   wherein at least one of the plurality of second wires is disposed on a region corresponding to the first region.

6. The display device of claim 5, further comprising vias disposed in the holes.

7. The display device of claim 6, wherein at least one of the holes and vias is disposed on the second region.

8. The display device of claim 5, wherein at least one of the plurality of first wires is disposed on a region corresponding to the first region.

9. The display device of claim 5, wherein at least one of the plurality of first wires is disposed on a region corresponding to the second region.

10. A display device comprising:
   a light module comprising a module substrate and a plurality of light sources disposed on the module substrate; and
   a drive circuit electrically connected to the light module and configured to control the plurality of light sources,
   wherein the module substrate includes:

an upper surface on which the plurality of light sources are disposed, and a lower surface opposing the upper surface;
a plurality of first wires disposed on the upper surface;
a plurality of second wires disposed on the lower surface;
a first region comprising at least one of the plurality of first wires and at least one of the plurality of light sources; and
a second region disposed on the module substrate and surrounding the first region,
wherein at least one of the plurality of second wires is disposed on a region corresponding to the second region, and
wherein at least one of the plurality of second wires is disposed on a region corresponding to the first region.

11. The display device of claim 10, further comprising holes disposed in the module substrate and vias disposed in the holes.

12. The display device of claim 11, wherein at least one of the holes and vias is disposed on the second region.

13. The display device of claim 10, wherein at least one of the plurality of first wires is disposed on a region corresponding to the first region.

14. The display device of claim 10, wherein at least one of the plurality of first wires is disposed on a region corresponding to the second region.

15. The display device of claim 11, wherein the holes and vias are disposed on the second region.

\* \* \* \* \*